(12) United States Patent
Heim

(10) Patent No.: US 9,142,363 B2
(45) Date of Patent: Sep. 22, 2015

(54) METHOD FOR FORMING A SENSOR ELECTRODE FOR A CAPACITIVE SENSOR DEVICE

(71) Applicant: Microchip Technology Germany GmbH II & Co. KG, Ismaning (DE)

(72) Inventor: Axel Heim, Munich (DE)

(73) Assignee: MICROCHIP TECHNOLOGY GERMANY GMBH, Gilching (DE)

( * ) Notice: Subject to any disclaimer, the term of this patent is extended or adjusted under 35 U.S.C. 154(b) by 102 days.

(21) Appl. No.: 13/778,394

(22) Filed: Feb. 27, 2013

(65) Prior Publication Data

US 2014/0238834 A1    Aug. 28, 2014

(51) Int. Cl.
| | | |
|---|---|---|
| H01G 7/00 | (2006.01) | |
| H01H 1/06 | (2006.01) | |
| H01H 11/04 | (2006.01) | |
| H03K 17/96 | (2006.01) | |

(52) U.S. Cl.
CPC .................. *H01H 1/06* (2013.01); *H01H 11/04* (2013.01); *H03K 17/9622* (2013.01); *H03K 2017/9602* (2013.01); *H03K 2217/96078* (2013.01); *Y10T 29/49105* (2015.01)

(58) Field of Classification Search
USPC ...................... 29/25.41, 417, 592.1, 593, 595; 324/681–688
See application file for complete search history.

(56) References Cited

U.S. PATENT DOCUMENTS

| | | | |
|---|---|---|---|
| 7,274,623 B2* | 9/2007 | Bayram et al. ................ | 367/140 |
| 8,104,354 B2* | 1/2012 | Hsu et al. ........................ | 73/718 |
| 2005/0219953 A1* | 10/2005 | Bayram et al. ................ | 367/178 |
| 2006/0180450 A1* | 8/2006 | Clark et al. .................... | 200/333 |
| 2008/0221427 A1* | 9/2008 | Petersen ........................ | 600/407 |
| 2012/0312931 A1* | 12/2012 | Recksiek et al. .............. | 244/203 |

FOREIGN PATENT DOCUMENTS

| | | | |
|---|---|---|---|
| GB | 2015167 A | 9/1979 | ............. G01D 5/241 |
| WO | 01/08925 A1 | 2/2001 | ............... B60Q 1/48 |
| WO | 2008/079596 A1 | 7/2008 | ............. G06F 3/033 |

OTHER PUBLICATIONS

International Search Report and Written Opinion, Application No. PCT/EP2014/052971, 15 pages, Jun. 6, 2014.

* cited by examiner

*Primary Examiner* — Paul D Kim

(74) *Attorney, Agent, or Firm* — Slayden Grubert Beard PLLC

(57) ABSTRACT

A sensor electrode (SE) for a capacitive sensor device is designed such that the width of the sensor electrode decreases towards the center such that the capacity between the sensor electrode and an object (F) with constant distance between the sensor electrode and the object (F) substantially is equal in size for each position of the object (F) relative to the sensor electrode along a longitudinal axis of the sensor electrode. The sensor electrode may consist of a plurality of segments arranged in a strip with decreasing width towards the center of the electrode.

18 Claims, 9 Drawing Sheets

METHOD FOR FORMING A SENSOR ELECTRODE FOR A CAPACITIVE SENSOR DEVICE

TECHNICAL FIELD

The present disclosure relates to a method for forming a sensor electrode for a capacitive sensor device from an electrode, wherein the electrode has a predetermined electrode shape. The present disclosure further relates to a sensor electrode for a capacitive sensor device, which is formed following the above mentioned method.

BACKGROUND

In conventional systems is known to provide capacitive sensor devices for detecting an approaching object or a contact, respectively, by means of which an approach of an object towards a sensor electrode or a movement of an object relative to the sensor electrode may be measured in contactless fashion. The measurement signal is interpreted and the result may be used to trigger functions, for example switching functions of an electric device, in particular of an electric hand-held device.

Conventional capacitive sensor systems comprising one or several sensor electrodes, however, have the disadvantage that during a movement of an object, for example of a finger, relative to the sensor electrode the measurement values during constant distance of the object to the sensor electrode may differ in absolute value.

For example, when the measurement values of a sensor electrode of a capacitive sensor system, which is widespread and flat as compared to a finger, are observed during a movement of a finger in the direction of X with constant Y and Z, wherein Z represents the distance of the finger from the electrode plane, then the measurement values initially increase, have a maximum approximately in the center of the electrode plane and then decrease. During a sufficiently quick movement of the finger in the direction of X relative to the electrode plane, the measurement signal looks similar to the measurement signal of a contacting movement, i.e. of the movement of a finger in the direction of Z. This means that a change of the measurement value of the sensor electrode may not conclusively be related to a change of the distance of the finger from the sensor electrode (Z distance). The variation of the measurement values also may have other reasons. Particularly for the contact detection (at a distance Z=0), in consequence of the varied dependencies of the measurement value, i.e. the measurement value not only depends on the distance of the finger from the sensor electrode, the interpretation of the signal curves partially is so much complicated that certain functionalities, for example "drag and drop", may not be ensured reliably.

A similar problem also occurs in strip-type sensor electrodes SE known in prior art, as for example shown with reference to FIG. 1. When a finger F at a constant distance Z between the finger F and the sensor electrode SE moves across the sensor electrode SE in the direction of X, then the measured sensor value changes as shown in the signal curve in FIG. 1. For example, as shown in FIG. 1, in a strip electrode of a length of 10 cm (X=−5 cm to X=+5 cm) the measured sensor value will be u (X=0)>u (X≠0) because the capacity between the sensor electrode SE and the finger F is greatest in the center of the strip, i.e. at X=0, while the capacity between the sensor electrode SE and the finger F is smallest at the edge regions. Theoretically, there is information in this variation of the measurement values; however, it may not be directly related to the movement of the finger F in a certain direction.

In conventional systems, it is attempted to take into account this non-homogeneous behavior in the signal processing, i.e. in the processing of the measurement signal of the sensor electrode SE, by additionally taking into account information of other sensors. For example, the Z-value may be determined from weighted sensor values of several adjacent sensor electrodes. However, this solution only works satisfyingly for Z>>0 when the finger clearly is inside the detection zone of all electrodes. However, this solution is not appropriate for contact detection (Z=0), since on the basis of the ambiguity of the measurement values, i.e. during a contact the measurement value not only depends on the distance Z of the finger from the sensor electrode SE, the interpretation of the signal curves in part is complicated that considerably that certain functionality may not be ensured reliably.

SUMMARY

Therefore, a need exists to provide solutions, which at least in part avoid disadvantages known from conventional systems and by means of which to the greatest possible extent it is ensured that the measured sensor value, independent of the position of the object relative to the sensor electrode, substantially is constant during constant distance of an object from the sensor electrode.

According to various embodiments, a method for forming a sensor electrode for a capacitive sensor device from a given electrode can be provided, which has a predetermined electrode shape, and furthermore a sensor electrode for a capacitive sensor device can be provided.

According to an embodiment, in a method for forming a sensor electrode for a capacitive sensor device from an electrode, which has a predetermined electrode shape, (a) the electrode is subdivided into a predetermined number of electrode segments, wherein each electrode segment has a predetermined electrode surface area,
(b) at a predetermined distance of an object from the electrode a sensor value is determined for each electrode segment,
(c) that electrode segment is determined, in which the sensor value is the smallest,
(d) that electrode segment is determined, in which the sensor value is the greatest,
(e) the surface area of the electrode segment, in which the sensor value is the smallest, is increased, and
(f) the surface area of the electrode segment, in which the sensor value is the greatest, is decreased.

BRIEF DESCRIPTION OF THE DRAWINGS

Details and characteristics of various embodiments result from the following description in connection with the drawings, in which.

DETAILED DESCRIPTION

Figure 1:
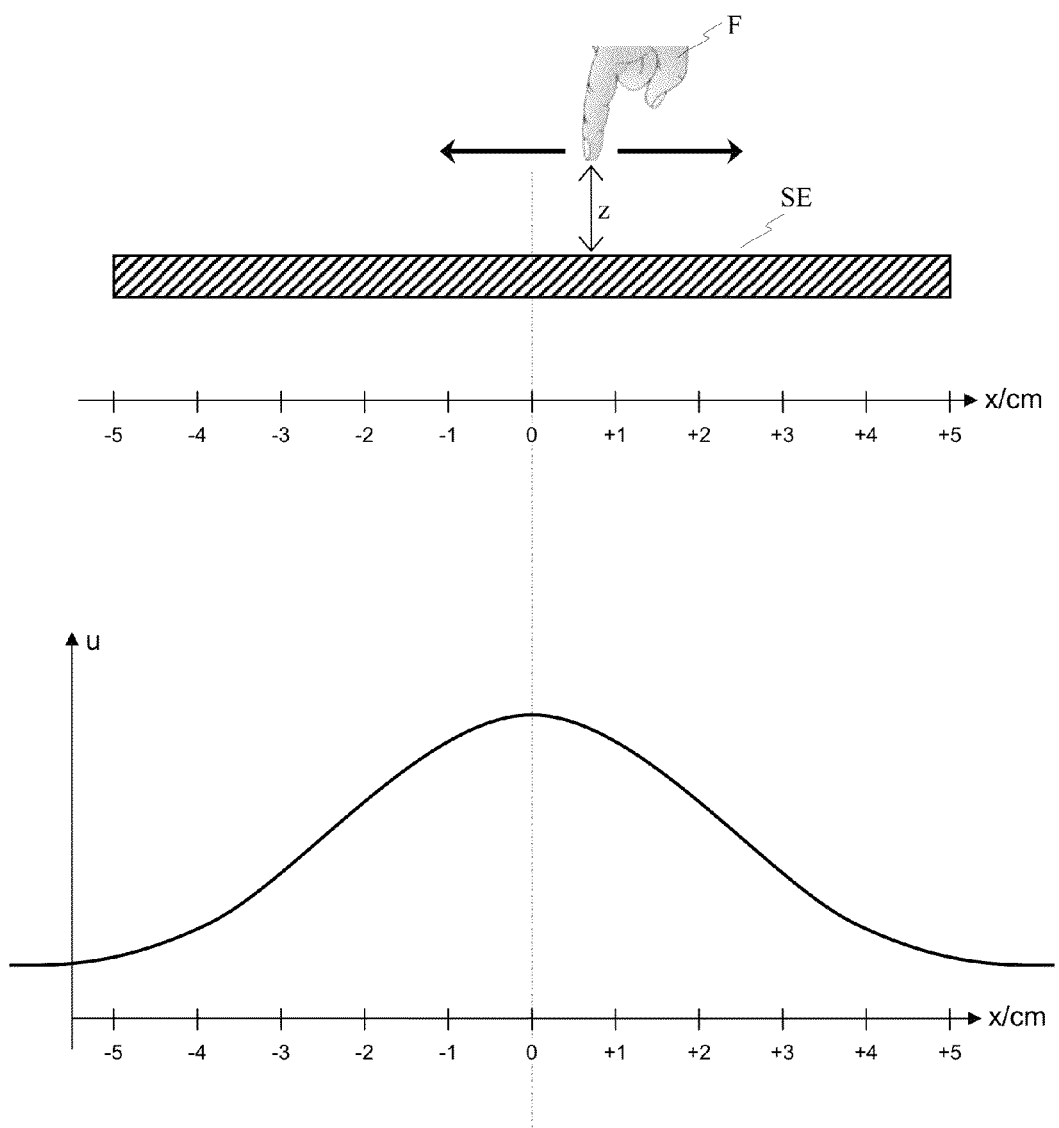
FIG. 1 shows a conventional sensor electrode with an associated signal curve of the measurement values.

As stated above, in a method for forming a sensor electrode for a capacitive sensor device from an electrode, which has a predetermined electrode shape, (a) the electrode is subdivided into a predetermined number of electrode segments, wherein each electrode segment has a predetermined electrode surface area, (b) at a predetermined distance of an object from the electrode a sensor value is determined for each electrode segment, (c) that electrode segment is determined, in which the sensor value is the smallest, (d) that electrode segment is determined, in which the sensor value is the greatest, (e) the surface area of the electrode segment, in which the sensor value is the smallest, is increased, and (f) the surface area of the electrode segment, in which the sensor value is the greatest, is decreased.

According to various embodiments, the following may apply alone or in combination as appropriate: It may be advantageous when the predetermined electrode surface areas of the electrode segments are equal in size. The surface area of the electrode segment may be increased by a predetermined value in step (e). Furthermore, in step (f) the surface area of the electrode segment may be decreased by a predetermined value. It can be further advantageous when the surface area of the electrode segment is increased in step (e) when the sensor value is smaller than a predetermined sensor reference value. The surface area of the electrode segment may be decreased in step (f) when the sensor value is greater than a predetermined sensor reference value. The steps (b) to (f) may be repeated so long until a predetermined abort criterion is fulfilled. The abort criterion may then be fulfilled when the sensor values for each electrode segment substantially are equal in value. The electrode may have a substantially rectangular shape, wherein the electrode segments subdivided in step (a) have a substantially equal width. In step (e) the width of the respective electrode segment may be increased, wherein in step (f) the width of the respective electrode segment may be decreased. The width of the sensor electrode may decrease towards the center such that the capacity between the sensor electrode and an object during constant distance between the sensor electrode and the object for each position of the object relative to the sensor electrode along a longitudinal axis of the sensor electrode substantially is equal in size. The sensor electrode may have a substantially strip-type shape. The sensor electrode also may have a substantially rectangular shape. According to various embodiments, however, the sensor electrode may also have any other shape.

According to various embodiments, a sensor electrode can be formed such that for all positions of an object F relative to the sensor electrode the sensor values or the measurement values within a certain detection range at substantially constant distance of the object F to the sensor electrode are virtually constant. The measurement electronics itself and the remaining sensor system, respectively, do not have to be adapted in this case. The forming according to various embodiments of the sensor electrode has the advantage, that the signal processing of the measurement signal is simplified significantly, because on the one hand the previously mentioned ambiguity of the measurement values is avoided and on the other hand the measured sensor values during constant distance of the object from the sensor electrode substantially is constant, so that the distance of the object from the sensor electrode for each position of the object relative to the sensor electrode may be determined more simple.

According to various embodiments, the sensor surface area of the sensor electrode is reduced in locations, in which the sensor value is too large, for example by tapering a strip electrode towards the center. For example, the sensor electrode SE shown in FIG. 1 would be formed narrower in a region around X=0 so that the difference between the measurement values when the finger F is in the region of X=0 and the measurement values when the finger F is in the regions of X=−5 cm and X=+5 cm is reduced or minimized.

As can be seen in FIG. 1 the smallest sensor values or measurement values normally are obtained at the edges of the sensor electrode SE, i.e. in the regions around X=−5 cm and X=+5 cm. The largest measurement values, however, are obtained in a region around X=0. According to various embodiments, the inner region of the sensor electrode SE is reduced substantially in its surface area such that the difference between the measurement values at the inner region of the sensor electrode and the measurement values at the outer regions of the sensor electrode substantially tends to be 0, so that by means of decreasing or increasing the electrode surface area at the inner or at the outer region of the sensor electrode the measurement values of the sensor electrode are reduced or increased.

By means of adjusting or forming the sensor electrode such that the measurement values substantially stay constant in the whole range of the sensor electrode during constant distance of the object from the sensor electrode, the signal processing of the measurement values or of the measurement signal, respectively, becomes significantly more robust, which in the whole range of the sensor electrode results in a significantly improved detection of the distance of the object from the sensor electrode.

Figure 2:
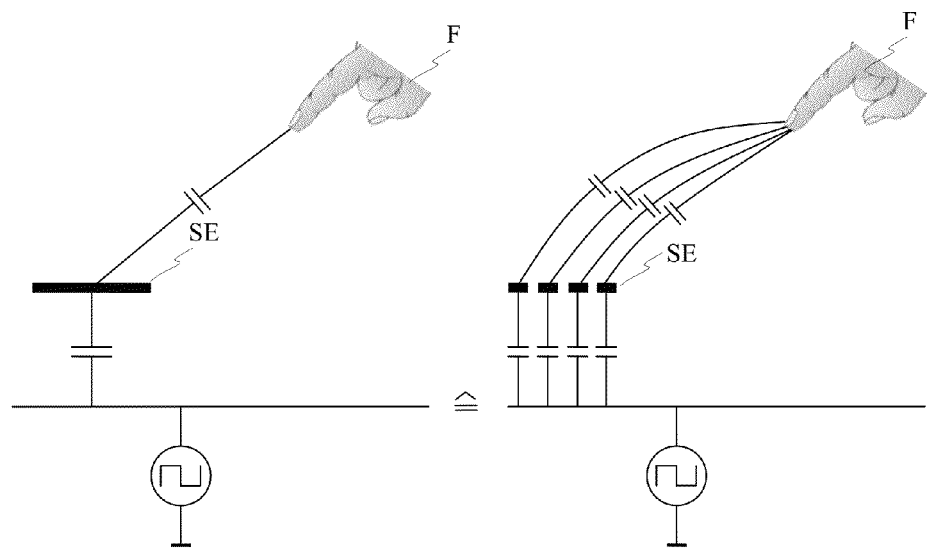
FIG. 2 shows a widespread sensor electrode as well as an electrode configuration comprising a number of sensor electrodes with small surface areas, whose overall surface area corresponds to that of the widespread sensor electrode.

FIG. 2 shows in a very simplified manner a widespread sensor electrode SE and several sensor electrodes SE comprising small surface areas, wherein the sensor electrodes SE comprising small surface areas as a whole substantially are equivalent to the widespread sensor electrode SE. The widespread sensor electrode SE may be understood as a number of closely adjacent sensor electrodes SE comprising small surface areas, which are short-circuited with one another. The capacitive voltage divider between a generator electrode, the widespread sensor electrode SE and an object F is represented or formed, respectively, by means of a parallel circuit of several sub-voltage dividers between the generator electrode, the sensor electrodes SE comprising small surface areas, and the object F.

When one or more segments of the sensor electrodes comprising small surface areas are removed, on the one hand the capacity between the generator electrode and the sensor electrode (which consists of several segments) is reduced. On the other hand, the capacity between the sensor electrode SE and the object F, which has to be adapted or optimized, respectively, is reduced, and this all the more, the more precisely the segment removed is located beneath the object F.

According to various embodiments, in doing so the dependency of the sensor values from the position X of the object relative to the sensor electrode is significantly reduced across a large range of the sensor electrode. The adaptation or the optimization, respectively, of the curve of the sensor value between the sensor electrode and the object F according to various embodiments is carried out for a predetermined distance of the object F from the sensor electrode SE (Z distance) as well as for a certain shape of the object F (for example for a certain shape of finger or hand, respectively). It may be particularly preferred to carry out the adaptation or the optimization, respectively for very small distances between the sensor electrode SE and the object F (i.e. for very small Z distances).

Figure 3:
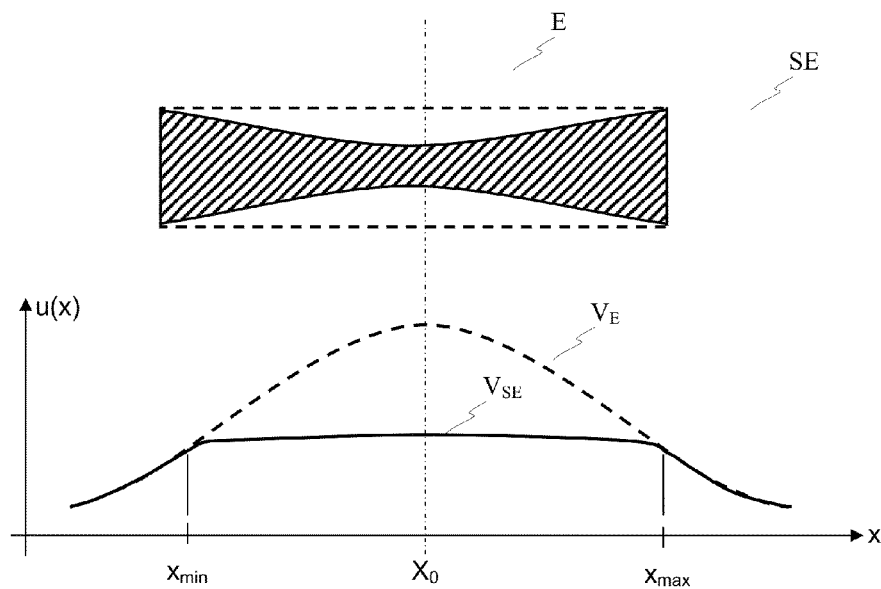
FIG. 3 shows an electrode as well as a sensor electrode formed from the electrode according to various embodiments and the respective associated signal curves of the measurement values.

FIG. 3 shows a strip-type sensor electrode SE as well as an electrode E, wherein the electrode E substantially is formed rectangular and wherein the strip-type sensor electrode SE is formed in a tapered manner towards the center, i.e. the width of the sensor electrode SE is smaller at the center region than at the outer regions.

Furthermore, shown in FIG. 3 is the signal curve VE of the measurement signal picked off at the electrode E as well as also the signal curve VSE of the measurement signal picked off at the sensor electrode SE. In both cases, a finger is moved in direction of X from Xmin to Xmax with constant distance (distance in direction of Z) between the finger and the electrode E or the sensor electrode SE, respectively. As previously described, the measurement signal VE picked off at electrode E has a minimum each in the regions Xmin and Xmax, while the measurement values between Xmin and Xmax are larger as at Xmin and Xmax, wherein in the region X0 the measurement signal VE has a maximum.

The signal VSE picked off at the sensor electrode SE, however, is substantially constant over the whole range between Xmin and Xmax, which according to various embodiments is reached in that the sensor electrode SE is formed in a tapered manner towards the center, which causes that the capacities between the sensor electrode SE and the finger F substantially are constant for each position of the finger F relative to the sensor electrode during constant distance of the finger F to the sensor electrode SE.

Figure 4:
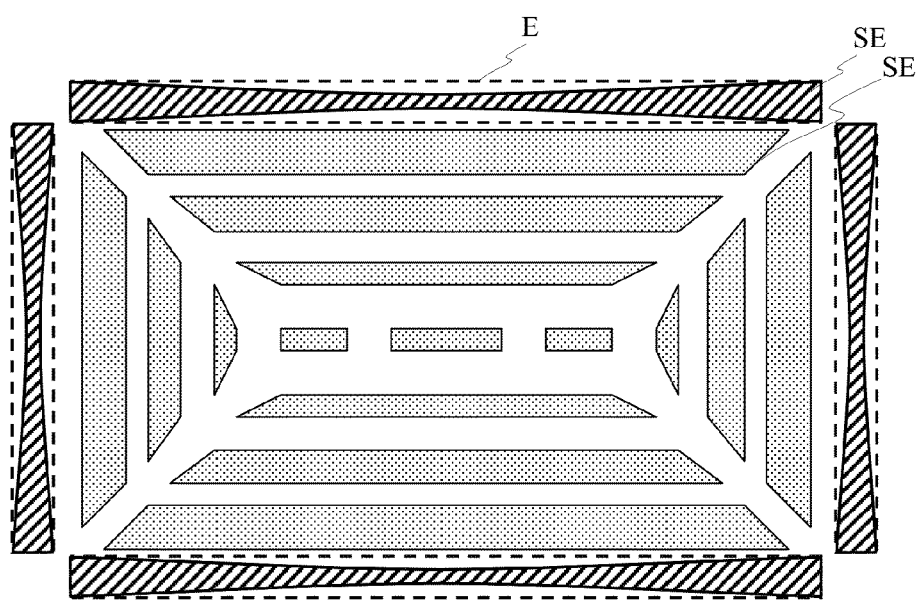
FIG. 4 shows four sensor electrodes formed according to various embodiments, which are arranged around further sensor electrodes according to various embodiments of the method.

FIG. 4 shows an example of an application of sensor electrodes formed according to various embodiments, wherein at the edge regions of a surface area sensitive to touching and approaching objects four strip-type sensor electrodes are arranged, which substantially are formed as shown in relation to FIG. 3. Again, the inner sensor electrodes are substantially strip-type sensor electrodes, wherein the width and therefore the surface area of the inner strip-type sensor electrodes is decreasing towards the center of the surface area sensitive to approaching objects, which substantially has the same effect as a tapering of a strip electrode towards the center of the strip electrode. The inner strip electrodes are arranged in a type of a grid structure here. The grid structure of the inner electrodes (the individual electrodes are short-circuited electrically one to the other) may also be formed significantly finer, so that an even further improved adaptation of the capacities between the finger and the inner electrodes is feasible.

Figure 5:
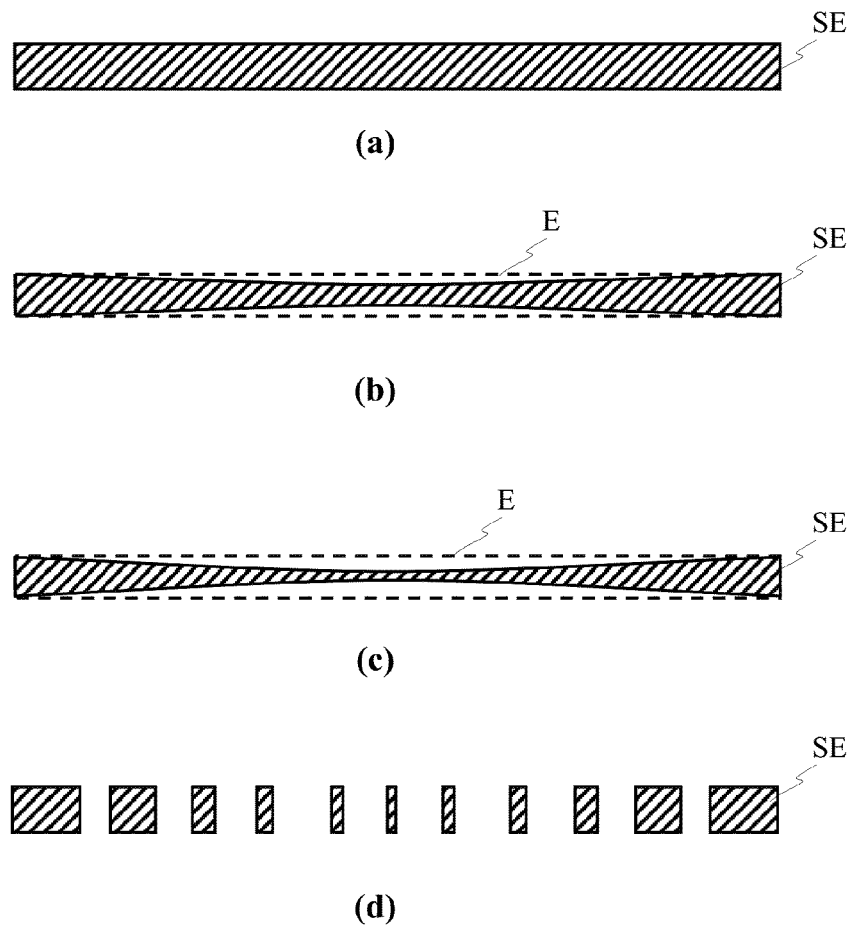
FIG. 5 shows a conventional strip-type sensor electrode as well as three further sensor electrodes formed from this sensor electrode.

FIG. 5 shows several sensor electrodes SE, each of which is formed differently. The measurement signals picked off at the respective sensor electrode SE are shown for different distances of an object F from the respective sensor electrode with reference to FIGS. 6a to 6d.

FIG. 5a shows a conventional strip electrode SE, which is formed substantially rectangular and has the same width across the complete range.

FIG. 5b shows a sensor electrode SE, which again substantially is formed in a strip-type manner, wherein the sensor electrode SE is formed in a tapered manner towards the center in order to reach the above described adaptation or optimization, respectively, of the capacities between a finger F and the sensor electrode SE at a constant distance of the finger F from the sensor electrode SE.

FIG. 5c also shows a strip-type sensor electrode SE, which substantially has the same shape as the strip-type sensor electrode SE according to FIG. 5b. As a difference to the sensor electrode SE according to FIG. 5b the tapering towards the center is significantly more pronounced, i.e. the width of the sensor electrode SE according to FIG. 5c in the region of the center of the sensor electrode is significantly smaller than the width of the sensor electrode SE in the region of the center according to FIG. 5b. This significantly more pronounced tapering may have disadvantages, as is described in relation to FIG. 6c.

FIG. 5d shows a segmented sensor electrode SE. The surface areas of the electrode segments of the sensor electrode SE become smaller towards the center of the sensor electrode, which substantially causes the same effect as a sensor electrode that is tapered towards its center. The electrode segments of the sensor electrode SE are electrically short-circuited to one another. Furthermore, it is feasible that the distance between two electrode segments is increased towards the center. As can be seen from FIG. 5d, also in the segmentation of the sensor electrode SE shown here the effective electrode surface area is reduced towards the center, which causes that the capacities between the sensor electrode SE and a finger F are substantially constant at constant distance of the finger F from the sensor electrode SE.

FIGS. 6a to 6d each show signal curves of measurement signals picked off from the sensor electrodes shown in FIGS. 5a to 5d.

Figure 6A:
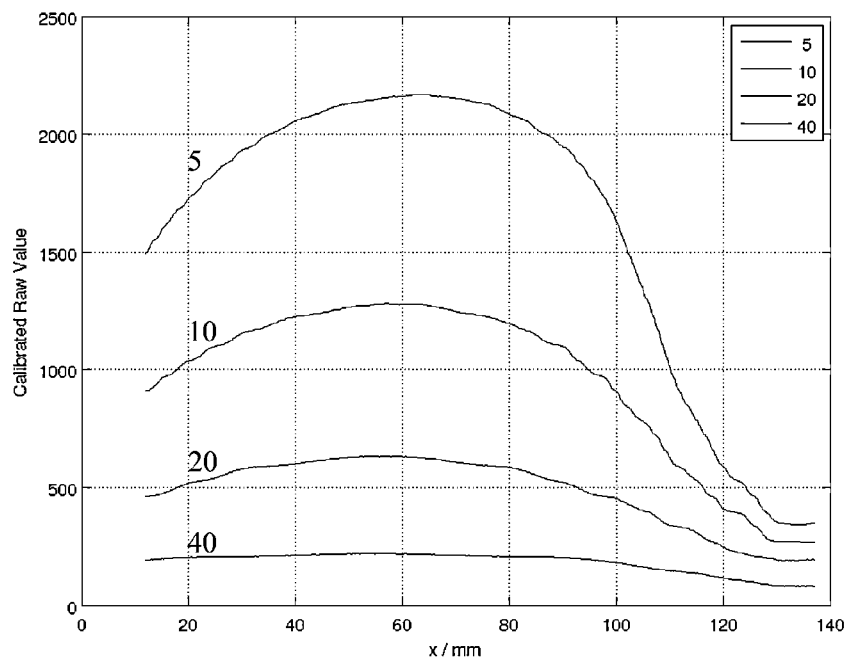
FIGS. 6a to 6d show signal curves for the sensor electrodes shown in FIG. 6 at respective different distances of a finger F from a sensor electrode.

FIG. 6a shows measurement signals of measurement signals picked off at the sensor electrode shown in FIG. 5a at a distance of an object F from the sensor electrode of 5 mm, 10 mm, 20 mm and 40 mm. As expected, for the distance Z=5 mm the measurement signal has a maximum in the center (at approximately X=60 mm), which significantly lies above the measurement values at the edge regions.

Figure 6B:
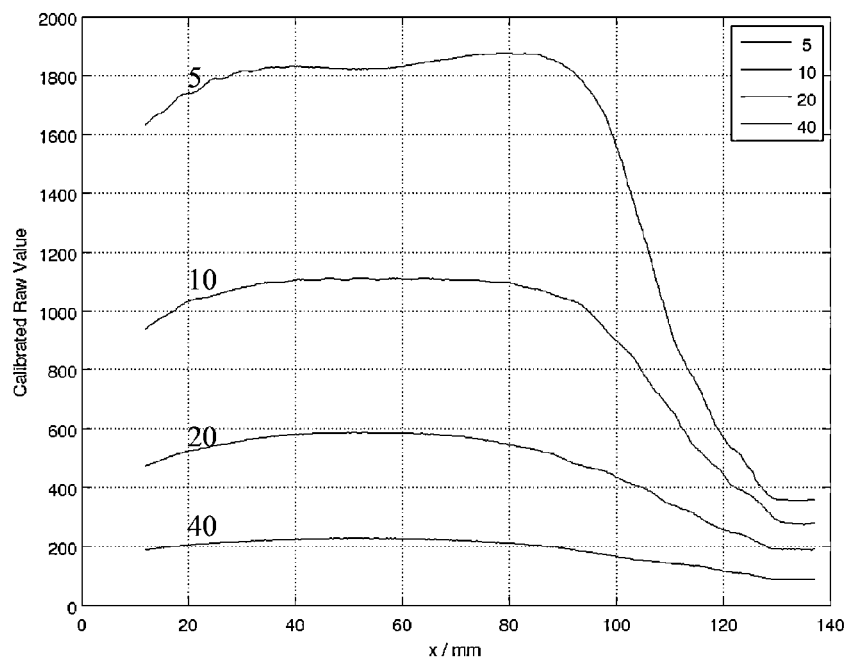

FIG. 6b shows measurement signals, which have been picked off at a sensor electrode according to FIG. 5b at a distance of an object from the sensor electrode of 5 mm, 10 mm, 20 mm and 40 mm. Since the sensor electrode shown in FIG. 5b is formed in a slightly tapered manner towards the center the measurement values are approximately constant for a relatively large interval from X (approximately between X=20 mm and X=90 mm), wherein the constant measurement values in this interval are a result of the tapering of the sensor electrode towards the center.

Figure 6C:
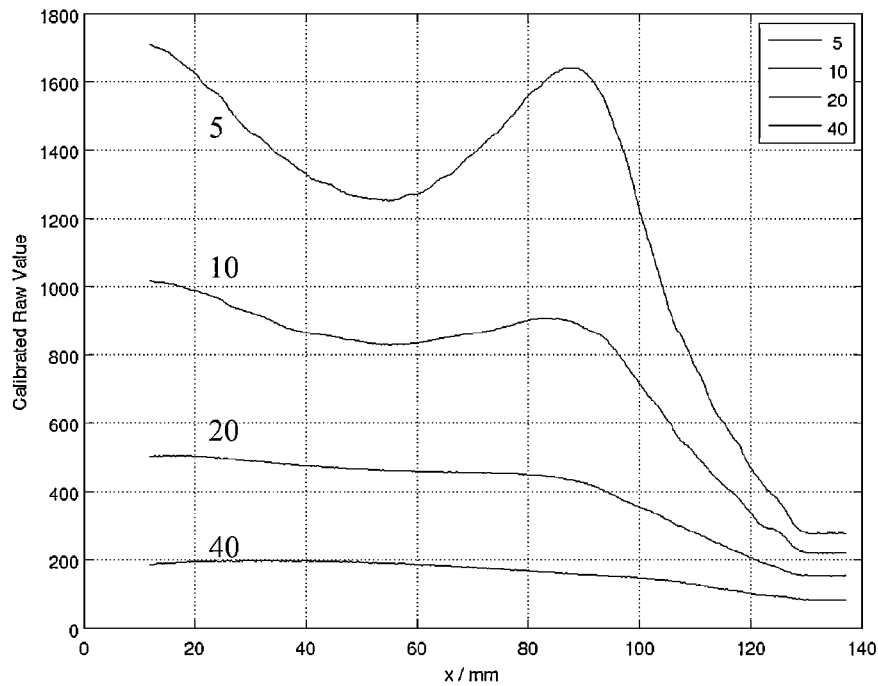
Figure 6D:
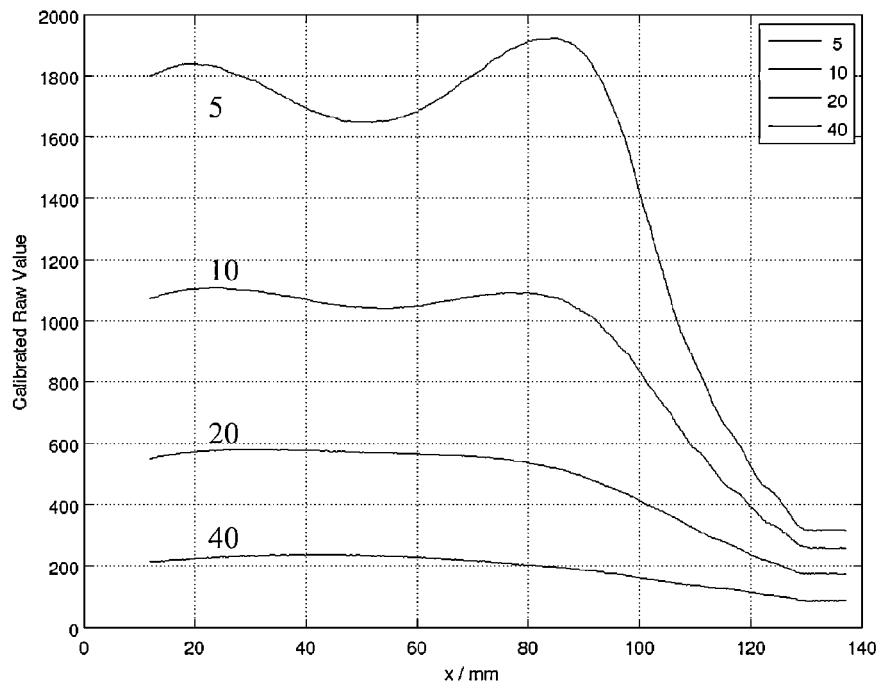

FIG. 6c and FIG. 6d each show measurement signals, which have been picked off at the sensor electrodes according to FIGS. 5c and 5d, respectively. It can be seen clearly, for example for the distance of 5 mm from the object to the sensor electrode, that the measurement signal decreases towards the center (approximately in the range of X=60 mm) and even shows a local minimum here. These local minima result from the fact that too much electrode surface area has been removed towards the center in the electrodes according to FIG. 5c and FIG. 5d, respectively, so that the capacity between the sensor electrode SE and a finger F at constant distance of the finger F from the sensor electrode SE becomes significantly smaller in the center area of the sensor electrode.

The examples shown in FIG. 5 and FIG. 6 confirm that by means of forming of the sensor electrodes according to various embodiments the variance of the measurement values at a constant distance of an object F from the sensor electrode may be held small across a large range of X (as well as across a large range of Y in the three-dimensional case).

Figure 7:
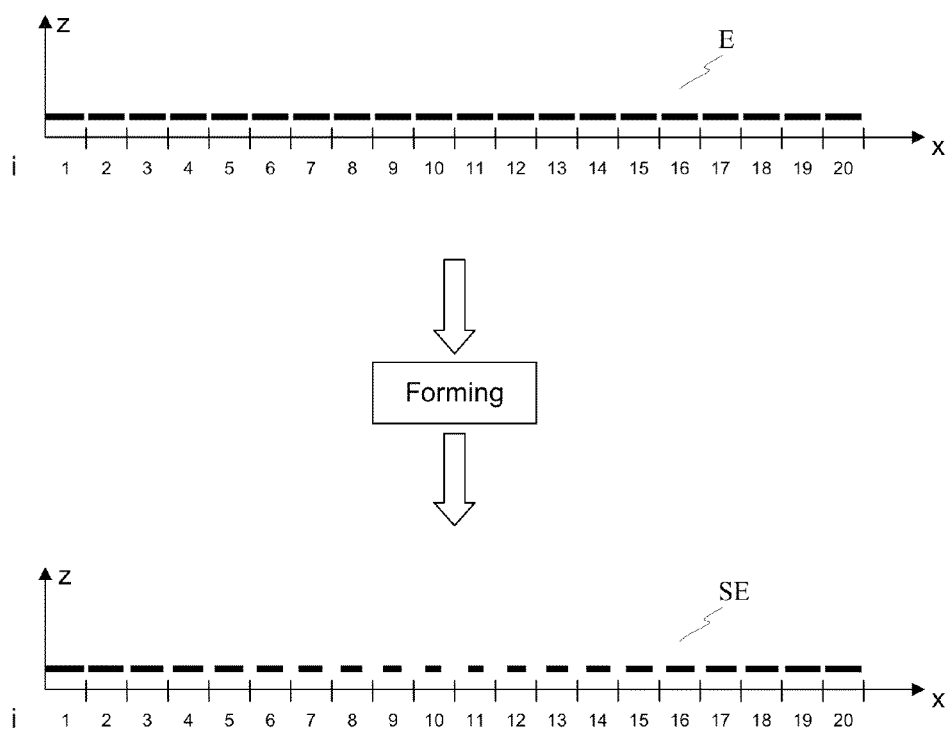
FIG. 7 shows an electrode subdivided into electrode segments, as well as an corresponding sensor electrode formed according to the method according to various embodiments.
Figure 8:
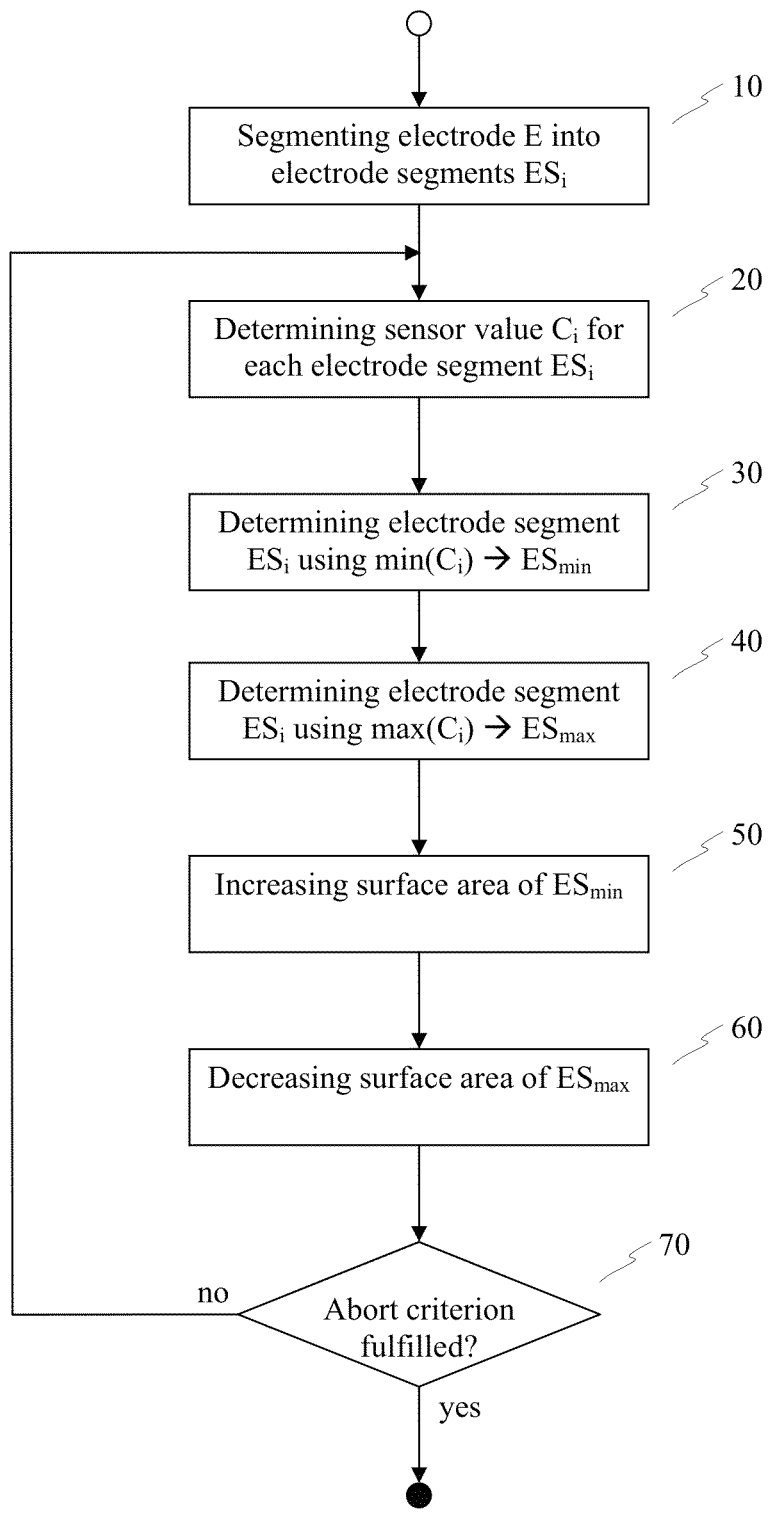
FIG. 8 shows a flowchart of a method according to various embodiments.

With reference to FIG. 7 the concept for forming a sensor electrode for a capacitive sensor device from an electrode E is briefly described. With reference to FIG. 8 the method according to various embodiments for forming a sensor electrode is described in more detail.

According to various embodiments, for a given electrode E a method according to various embodiments for forming a sensor electrode is carried out, wherein the sensor electrode SE resulting therefrom has the previously described characteristics, namely that the capacity between an object F and the sensor electrode SE and therefore the measured sensor value at a constant distance of the object F from the sensor electrode SE and independent of the position of the object relative to the sensor electrode SE substantially remains constant.

According to various embodiments the given electrode E (virtually) is segmented into a number of electrode segments, wherein in an iterative method the surface areas of the individual electrode segments are increased or decreased so long until the sensor electrode SE resulting therefrom has the desired, previously mentioned characteristics.

As can be seen in FIG. 7, the method according to various embodiments for forming a sensor electrode results in that the width of the electrode segments of the sensor electrode SE decreases towards the center, wherein the surface areas of the electrode segments decrease towards the center to that extent that at a constant distance of an object F from the sensor electrode SE a substantially constant sensor value is measured substantially across the whole range of the sensor electrode SE.

With reference to FIG. 8 the method according to various embodiments is described in detail.

In a first step 10 a given electrode or electrode structure is subdivided into a predetermined number of electrode segments ESi, wherein each electrode segment has a predetermined electrode surface area. Preferably, the electrode segments produced in step 10 have the same electrode surface area. In a modification of the method according to various embodiments, however, the electrode segments also may have differing electrode surface areas. It should be noted, that the given electrode or electrode structure, respectively, is not physically dissected into electrode segments, but only "virtual" electrode segments are produced, which become the basis for the consecutive steps.

In the consecutive steps 20 to 60 the surface area of the electrode segments iteratively is adapted so long until the sensor electrode resulting from the electrode segments and the respective measured sensor values have the previously described characteristics.

Following step 10 a position Xi (or (Xi, Yi)) is assigned to each (virtual) electrode segment, wherein Xi (or (Xi,Yi)) may be the center point of the electrode segment. Subsequently, a (virtual) finger is arranged at the position Xi (or (Xi, Yi)) relative to the sensor electrode with a predetermined distance Z from the sensor electrode.

In step 20, for each (virtual) electrode segment ESi a sensor value Ci is calculated and determined, respectively. After the respective sensor value Ci has been determined and calculated, respectively, for each electrode segment ESi, in the next step 30 that electrode segment is determined, for which the smallest sensor value min(Ci) has been determined. The electrode segment determined in this manner is denoted ESmin in the following. Further, that electrode segment is determined in step 40, for which the largest sensor value max(Ci) has been determined. The electrode segment determined in this manner is denoted ESmax in the following.

In den following steps 50 and 60, for the electrode segments ESmin and ESmax determined in this manner the surface area is adjusted, so that the respective sensor values approximate the sensor values of the remaining electrode segments. Accordingly, according to various embodiments in step 50 the surface area of the electrode segment $ES_{min}$ is increased and in step 60 the surface area of the electrode segment $ES_{max}$ is decreased.

It may be provided for that the surface areas of the electrode segments ESmin and ESmax only then are increased and decreased, respectively, when the respective sensor values are below and above, respectively, of a predetermined sensor reference value. Furthermore, it may be provided for that the surface area of the respective electrode segment ESmax and ESmin, respectively, in each case is increased and decreased, respectively, by a predetermined value. Furthermore, it may be provided for that a given minimum and maximum sensor element surface area, respectively, is not exceeded or does not fall short, respectively.

After increasing and after decreasing, respectively, of the electrode surface areas in steps 50 and 60, respectively, it is verified in step 70, whether a predetermined abort criterion is fulfilled. When the abort criterion is not fulfilled, the method is continued with step 20 and again the sensor values of the individual electrode segments are determined, an electrode segment ESmin and an electrode segment ESmax are determined and the surface areas of the electrode segments ESmin and ESmax are increased and decreased, respectively. By means of this iteration, which is continued until the abort criterion in step 70 is fulfilled, the sensor values of the individual electrode segments converge until finally substantially the same sensor values are measured and determined, respectively, at each electrode segment.

For example, as an abort criterion in step 70 the difference between the maximum sensor value and the minimum sensor value of the electrode segments may be used. When this difference is smaller than a predetermined threshold value, the iteration may be aborted. The sensor values of the remaining electrode segments then each fall between the minimum and the maximum sensor values.

Alternatively, as an abort criterion also the distance of the maximum sensor value or the minimum sensor value, respectively, from a medium sensor value of the remaining or of all electrode segments, respectively, may be used. When the distance of the maximum sensor value or the minimum sensor value, respectively, from the medium sensor value is greater than a predetermined threshold value, the iteration is continued.

Further, provided as an abort criterion also may be a loop detection, which signals that a certain sequence of variations is repeated. The loop detection may be realized such that the temporal sequence of the variations is stored and when a variation occurs it is checked whether it is already part of the stored temporal sequence. When this is the case, the iteration is aborted.

In the above described method the surface area of the electrode segments ESmin and ESmax is decreased and increased, respectively. For example, this may be carried out by adapting the width and/or the length of the respective electrode segment. Further, it may also be present in the above described method that after a number of iterations only the electrode segment ESmin or only the electrode segment ESmax has to be adapted, for example because the respective other electrode segment ESmax or ESmin already has the desired sensor value.

The above mentioned method may also be carried out for different distances of the object from the electrode and from the electrode segments, respectively. As an example, the electrode segments at first may be adapted for a first distance of the object of 5 mm from the electrode segments. After the abort criterion is fulfilled in step 70 for this first distance, the steps 20 to 70 may be repeated for a further distance, for example for a distance of 10 mm between the object and the electrode segment. The final size of each electrode segment then, for example, may be determined as the medium value of the values resulting from the two runs of the method. This way it is reached that an electrode shape for a sensor electrode may be formed, in which the capacities are substantially constant at a distance of 5 mm as well as at a distance of 10 mm. In order to further optimize the electrode shape of the sensor electrode the method may be carried out for several predetermined distances.

After executing the method according to various embodiments, also a smoothing of the electrode shape may be carried out as long as the distribution of the surface area across the whole electrode substantially remains unaltered.

The sensor electrode formed or the electrode shape/electrode structure determined according to the method according to various embodiments is used to manufacture a tangible physical sensor electrode.

Furthermore, the above described method may also be used for widespread sensor electrodes, wherein in step 10 the widespread sensor electrode may be dissected into a number of electrode segments arranged in a grid, as for example described with reference to FIG. 4.

Figure 9:
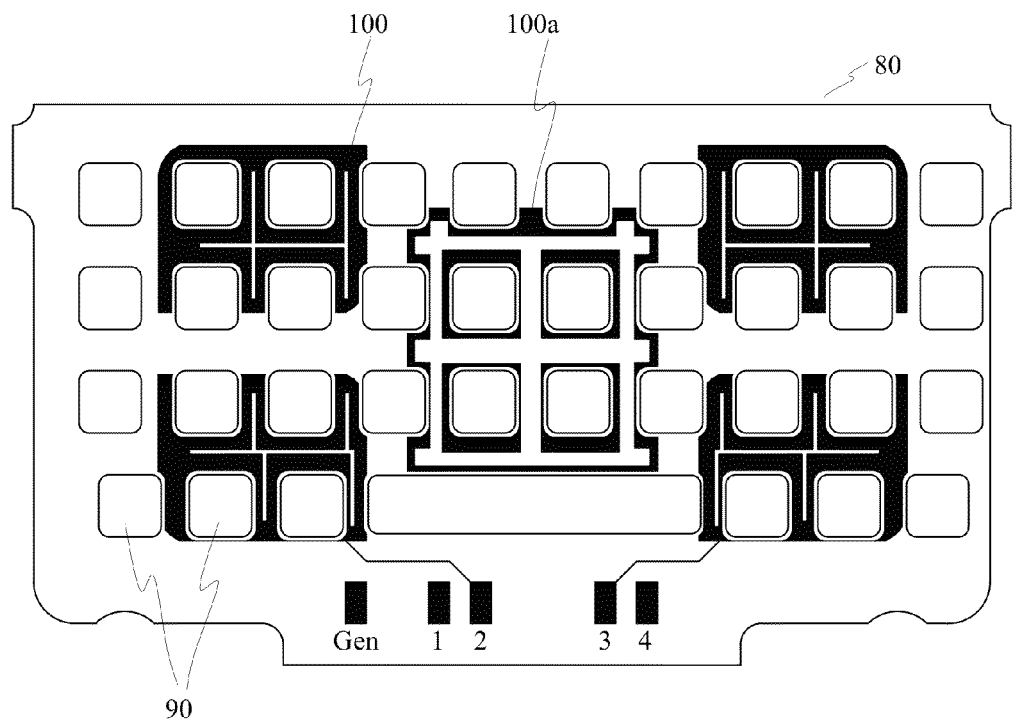
FIG. 9 shows an embodiment of sensor electrodes for use in a keyboard.
Figure 9:
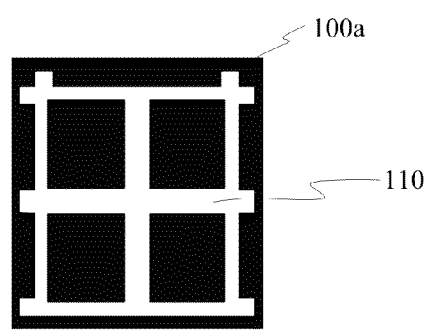

FIG. 9 shows a sensor electrodes according to various embodiments for use in a keyboard 80. The keyboard 80 has a number of keys 90. Sensor electrodes 100, 100a are arranged between (and if applicable also beneath) the keys 90. The sensor electrodes 100 and 100a are formed according to various embodiments of the method or as disclosed in the various embodiments as shown in FIGS. 3-5.

In FIG. 9, the sensor electrode 100a is depicted separately. The sensor electrode 100a substantially formed rectangular has recesses 110. The recesses 110 are formed such that the width of the recesses in the inner region of the sensor electrode 100a (the cross-shaped recess) is greater than the width of the outer recesses. By means of this shape of the recesses the previously described effect is realized substantially, namely that the sensor values substantially remain constant at a substantially constant distance between finger and sensor electrode independent of the position of the finger relative to the sensor electrode.

Hence, according to an embodiment, a sensor electrode (SE) for use in a keyboard may also comprise a plurality of sensor segments wherein the width of each sensor segment decreases towards a center of the sensor electrode such that the capacity between the sensor electrode and an object (F) with constant distance between the sensor electrode and the object (F) substantially is equal in size for each position of the object (F) relative to the sensor electrode along a longitudinal axis of the sensor electrode.

According to another embodiment, a sensor electrode for use in a keyboard may comprise a rectangular shaped electrode having recesses as explained above, wherein the recesses are formed such that the width of the recesses in the inner region of the sensor electrode is greater than the width of the outer recesses.

According to a further embodiments of such a sensor electrode, the recesses can be designed to form separate electrode segments in an inner area of the sensor electrode. According to a further embodiments of such a sensor electrode, the recesses can be arranged such inside an inner area of the sensor electrode that a ring surrounding the inner area is formed. According to a further embodiments of such a sensor electrode, sensor values that can be obtained from said sensor electrode substantially remain constant at substantially constant distance between finger and sensor electrode independent of the position of the finger relative to the sensor electrode.

According to yet another embodiment, a keyboard may comprise at least one of said sensor electrodes as mentioned above.

According to yet another embodiment of the keyboard, the sensor electrode can be arranged below a plurality of keys and the recesses can be arranged in an area between adjacent keys.

What is claimed is:

1. A method for designing a shape of a sensor electrode for a capacitive sensor device out of an electrode having an initial shape, wherein the method comprises the steps of:
   (a) subdividing the electrode into a predetermined number of electrode segments along a predetermined axis, wherein each electrode segment has a predetermined electrode surface area;
   (b) determining for each electrode segment respective sensor values when an object is located above each electrode segment at a predetermined constant distance from the electrode segment;
   (c) determining for which of the subdivided electrode segments the sensor value is the smallest;
   (d) determining for which of the subdivided electrode segment the sensor value is the greatest;
   (e) increasing the surface area of the determined electrode segment for which the sensor value is the smallest; and
   (f) decreasing the surface area of the determined electrode segment for which the sensor value is the greatest;
   wherein steps (b) to (f) are repeated until at desired sensor value response with respect to the object moving along the predetermined axis at the predetermined constant distance is reached.

2. The method according to claim 1, wherein the predetermined electrode surface areas of the electrode segments are equal in size.

3. The method according to claim 1, wherein at least one of: the surface area of the electrode segment is increased by a predetermined value in step (e) and the surface area of the electrode segment is decreased by a predetermined value in step (f).

4. The method according to claim 1, wherein the surface area of the electrode segment is increased in step (e) when the sensor value is smaller than a predetermined sensor reference value.

5. The method according to claim 1, wherein the surface area of the electrode segment is decreased in step (f) when the sensor value is greater than a predetermined sensor reference value.

6. The method according to claim 1, wherein after the desired sensor value response has been reached, steps (b) to (f) are repeated for a different distance of the object with respect to the electrode segments.

7. The method according to claim 1, further comprising the step of manufacturing the sensor electrode having the shape as determined by the steps of (a) through (f) of the method.

8. The method according to claim 1, wherein the electrode has initially a substantially rectangular shape, and wherein the electrode segments subdivided in step (a) have a substantially equal width and equal length.

9. The method according to claim 8, wherein at least one of: in step (e) the width of the respective electrode segment is increased, and in step (f) the width of the respective electrode segment is decreased.

10. A method for designing a shape of a sensor electrode for a capacitive sensor device out of an electrode having an initial shape, wherein the method comprises the steps of:
   (a) subdividing the electrode into a predetermined number of electrode segments along a predetermined axis, wherein each electrode segment has a predetermined electrode surface area,
   (b) while moving an object at constant distance along the predetermined axis, determining for each electrode segment a respective sensor value when the object is located above one of the electrode segment,
   (c) determining minimum and maximum the sensor values,
   (d) adjusting at least the predetermined electrode surface area of the electrode segment associated with the maximum value by decreasing a width or a length of the electrode segment,
   wherein steps (b) to (d) are repeated until at desired sensor value response with respect to the object moving along the predetermined axis at the constant distance is reached.

11. The method according to claim 10, wherein the predetermined electrode surface areas of the electrode segments are equal in size.

12. The method according to claim 10, wherein subdividing the electrode comprises physically separating the electrode segments, wherein the separated elements are coupled in parallel for measuring the sensor value.

13. The method according to claim 10, wherein the length of an electrode segment is decreased in step (d).

14. The method according to claim 10, wherein the width of an electrode segment is decreased in step (d).

15. The method according to claim 10, wherein after the desired sensor value response has been reached, steps (b) to (d) are repeated for a different distance of the object with respect to the sensor electrode.

16. The method according to claim 10, further comprising the step of manufacturing a sensor electrode having a shape as determined by the steps of (a) through (d) of the method.

17. The method according to claim 10, wherein the electrode has initially a substantially rectangular shape, and wherein the electrode segments subdivided in step (a) have a substantially equal width and equal length.

18. The method according to claim 17, wherein adjusting at least the predetermined electrode surface area comprises: the width of the respective electrode segment is increased, or the width of the respective electrode segment is decreased.

* * * * *